United States Patent [19]

Lee et al.

[11] Patent Number: 4,910,165

[45] Date of Patent: Mar. 20, 1990

[54] METHOD FOR FORMING EPITAXIAL SILICON ON INSULATOR STRUCTURES USING OXIDIZED POROUS SILICON

[75] Inventors: Steven S. Lee, Colorado Springs, Colo.; Dim-Lee Kwong, Austin, Tex.

[73] Assignee: NCR Corporation, Dayton, Ohio

[21] Appl. No.: 267,899

[22] Filed: Nov. 4, 1988

[51] Int. Cl.⁴ .............................................. H01L 21/20
[52] U.S. Cl. ............................... 437/90; 148/DIG. 26; 148/DIG. 17; 148/DIG. 152; 156/613; 357/49; 437/62; 437/71; 437/170; 437/239
[58] Field of Search ....................... 148/DIG. 3, 26, 41, 148/42, 50, 86, 98, 117, 152; 156/610-615; 357/49, 55; 437/26, 61, 71, 62, 81, 83, 89, 90, 97, 106, 110, 170, 235, 237, 238, 239

[56] References Cited

U.S. PATENT DOCUMENTS

| | | | |
|---|---|---|---|
| 3,640,806 | 2/1972 | Watanabe et al. | 437/62 |
| 3,919,060 | 11/1975 | Pogge et al. | 437/62 |
| 3,954,523 | 5/1976 | Magdo et al. | 437/71 |
| 4,016,017 | 4/1977 | Aboaf et al. | 437/71 |
| 4,104,090 | 8/1978 | Pogge | 437/71 |
| 4,380,865 | 4/1983 | Frye et al. | 437/62 |
| 4,393,577 | 7/1983 | Imai | 437/62 |
| 4,604,162 | 8/1986 | Sobczak | 437/62 |
| 4,628,591 | 12/1986 | Zorinsky et al. | 437/71 |
| 4,810,667 | 3/1989 | Zorinsky et al. | 437/62 |

FOREIGN PATENT DOCUMENTS

| | | | |
|---|---|---|---|
| 0136492 | 11/1978 | Japan | 437/62 |
| 0020677 | 2/1979 | Japan | 437/62 |
| 0020678 | 2/1979 | Japan | 437/62 |
| 0144149 | 8/1984 | Japan | 437/62 |
| 0144950 | 7/1985 | Japan | 437/62 |
| 0242636 | 12/1985 | Japan | 437/62 |

Primary Examiner—Brian E. Hearn
Assistant Examiner—William Bunch
Attorney, Agent, or Firm—Wilbert Hawk Jr.; Douglas S. Foote; Casimer K. Salys

[57] ABSTRACT

A silicon on insulator fabrication process and structure. The fabrication process includes a reproducible sequence in which an oxide covered substrate is anisotropically etched in the presence of a mask to form trenches which extend into the substrate. Epitaxial silicon is selectively grown in the trench regions in a sucession of first materially doped and thereafter lightly doped layers. The materially doped layer extends above the plane defined by the surface of the substrate. Following a selective removal of the oxide, the materially doped epitaxial layer is exposed at its sidewalls first to an anodization and then to an oxidation ambient. This successive conversion of the materially doped epitaxial layer first to porous silicon and then silicon dioxide dielectric isolates the lightly doped epitaxial layer from the substrate. Planarization of the structure and exposure of the epitaxial surfaces provides electrically isolated islands of monocrystalline silicon for bipolar and field effect device fabrication. A CMOS implementation of the epitaxial islands is readily undertaken by selective counterdoping in the presence of a mask.

14 Claims, 3 Drawing Sheets

METHOD FOR FORMING EPITAXIAL SILICON ON INSULATOR STRUCTURES USING OXIDIZED POROUS SILICON

BACKGROUND OF THE INVENTION

The present invention relates to integrated circuit structures and fabrication processes and more particularly to a silicon on insulator (SOI) class of products. In particular, these structures and processes involve epitaxial silicon regions electrically isolated by silicon dioxide dielectric from a silicon substrate.

SOI, as a general class of technology, has been in existence for a number of years, but has remained of somewhat limited applicability by virtue of its prevailing use of expensive sapphire as the substrate material. The benefits of SOI devices, including, among others, the absence of CMOS latch up problems and the elimination of fabrication steps need to isolate active regions, are well known. Heretofore, attempts to create monocrystalline silicon regions which are isolated by silicon dioxide dielectric from the silicon substrate have proven to be difficult and, consequently, not found significant commercial following. A representative approach is described in U.S. Pat. No. 4,604,162. Numerous similarly directed approaches appear in processes pursuing three dimensional integration. Although such processes and concluding structures are effective for limited application, their complexity and yield limitations have left them more as laboratory curiosities.

Some very recent works with similar objectives have revived heretofore discarded integrated circuit fabrication concepts involving, first, the formation of underlying porous silicon regions and, second, the oxidization of such formal regions to create isolating dielectrics beneath regions of epitaxial silicon. For instance, exemplary techniques are described in the article entitled "Porous Silicon Techniques for SOI Structures" by Tsao, which appeared in the Nov. 1987 issue of IEEE Circuits and Devices, page 3-7. The article provides an overview of how porous silicon can be used to create SOI structures. The anodization by which porous silicon regions are formed beneath defined active regions is selectively constrained by impurity type junction patterns. Thermal oxidation is used to convert the porous silicon into silicon dioxide.

The article entitled "SOI Technology Using Buried Layers of Oxidized Porous Si" by authors Barla et al., which appeared on pages 11-14 of the aforementioned technical publication, describes a fabrication technique in which successive epitaxial layers of different impurity concentration are blanket deposited in succession upon a silicon substrate, and then photolithographically masked and etched to selectively access areas of the underlying and highly doped layer susceptible to anodization. The porous silicon layer created by the anodization is thereafter oxidized to electrically isolate any overlaying epitaxial layers. A somewhat more refined variation on this fundamental technique is disclosed in U.S. Pat. No. 4,628,591, wherein the number of epitaxial layers has been increased and selectively varied in respective impurity concentration.

U.S. Pat. No. 4,716,128 sets forth a technique for forming active devices on epitaxial silicon. However, the active devices in the concluding structure are not isolated by dielectric from the substrate, the process does not involve the formation of a porous silicon underlayer, and the end product is a field effect transistor structure per se, unique in providing source/drain regions above the sidewalls of the epitaxial region. Accordingly, the reference merely confirms that epitaxial silicon may be selectively grown and thereafter used to form active devices.

There presently remains a need for a SOI fabrication process which utilizes oxidized porous silicon in a highly reproducible manner to create dielectrically isolated epitaxial silicon islands with accentuated decoupling from the substrate body.

SUMMARY OF THE INVENTION

In expanding upon the prior art, the present invention provides a process for creating silicon on isolator (SOI) type islands of epitaxial silicon isolated by silicon dioxide from the substrate. The critical formation of porous silicon regions beneath the islands of epitaxial silicon is less susceptible to process variables. Heavily doped sidewall regions are exposed to the anodization operation by which the heavily doped epitaxy is made porous. The sidewall windows through which such accentuated anodization occurs also contribute to the reproducibility and manufacturability of the structure during the oxidation of the porous silicon region, in that the oxygen atoms are provided a direct path into the porous region underlying the epitaxial silicon through the windows. The direct path for oxygen maximizes the efficiency of the oxygen transfer, reduces the oxidation time, and minimizes undesirable silicon dioxide formation on the substrate.

The concluding structure when implemented according to the present process also exhibits a beneficial dimensional relationship, wherein the dielectric underlying the epitaxial silicon islands is of accentuated thickness by nature of the recess into the substrate. The thicker dielectric reduces direct capacitive coupling between the epitaxial silicon island and the substrate and substantially eliminates the coupling effects between the silicon islands and the substrate which might otherwise invert substrate regions proximate the silicon islands.

According to one embodiment of the fabrication process, a monocrystalline silicon substrate has formed thereupon a relatively thick layer of silicon dioxide and a photolighographically patterned layer of photoresist. An anisotropic etch of the silicon dioxide in the regions where the epitaxial silicon islands are to be formed is then used to remove the exposed silicon dioxide and a coincident region of the substrate itself. Following appropriate cleaning and strip of the photoresist, the substrate is subjected to a selective epitaxial growth of silicon in the regions lacking silicon dioxide, wherein the epitaxial growth is monocrystalline in character. The epitaxial growth is begun with heavy in situ doping, which upon reaching a level materially above the plane of the substrate surface is changed to very light doping of the same impurity type. The thick silicon dioxide layer is thereafter selectively removed to expose pilar-like structures of epitaxial silicon which project above the plane of the substrate surface, which have a heavily doped lower layer with exposed sidewalls, and which have a lightly doped upper layer. Preferably, the heavily doped regions of epitaxial silicon extend into the substrate.

Anodization of the substrate follows, being implemented so that current is conducted through the heavily doped layer of the pilar-like epitaxy structure to selectively make such layer porous. The flow and anodization selectivity of the current is aided by the access provided through the sidewalls of heavily epitaxial layer.

The substrate, with pillars of porous epitaxial layer underlying lightly doped epitaxial layers, is then subjected to oxidation conditions which accentuate the conversion of the porous silicon layer to silicon dioxide. Consequently, the lightly doped epitaxial layer regions and substrate silicon grow relatively thin silicon dioxide layers. Oxidation is terminated when the porous silicon beneath the regions of lightly doped epitaxial silicon is fully converted to a silicon dioxide dielectric.

Preparation of the SOI structure for active device formation is concluded with a planarization sequence to fill the areas between the pilars with dielectric material. For example, a conformally deposited silicon dioxide sealing layer could be covered by a deposited polysilicon which is isotropic etched to the level of the lightly doped epitaxial layers and sealed by oxidation. The integrated active devices, namely field effect and bipolar transistors, are then fabricated in the electrically isolated lightly doped epitaxial layer regions.

The islands of lightly doped epitaxial silicon can be changed as to impurity type using a masked implant operation, thereby facilitating the fabrication of CMOS field effect transistors or complimentary bipolar devices.

These and other features of the present invention will be more fully understood and appreciated upon considering the detailed embodiment which follows.

DESCRIPTION OF THE PREFERRED EMBODIMENT

Figure 1:
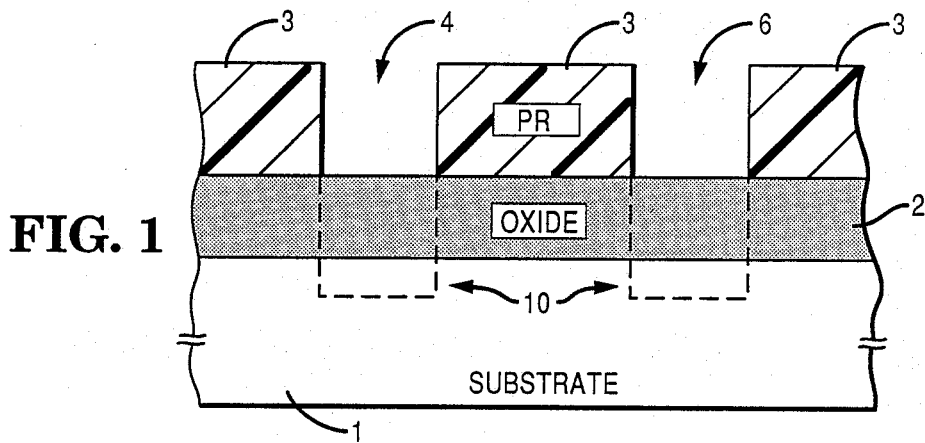
FIGS. 1-8 schematically depict in the cross section the appearance of a substrate structure at various stages in a fabrication sequence according to the present invention.

An exemplary sequence of the fabrication steps by which the present invention may be practiced to produce a silicon on insulator (SOI) structure with the desired features begins, as illustrated in FIG. 1, by forming on a monocrystalline silicon substrate 1 a thermally grown or chemical vapor deposited (CVD) silicon dioxide layer 2. Chemical vapor deposited silicon nitride over a thin silicon dioxide buffer layer is a possible alternative configuration for layer 2. Nominally, the thickness of layer 2 is in the range of 0.7-2.0 micrometers. As further illustrated in FIG. 1, a photoresist layer 3 is deposited over the silicon dioxide layer 2 and photolithographically patterned to expose regions 4 and 6 of silicon dioxide layer 2. As will be apparent at a later stage, regions 4 and 6 are the actual patterns of the epitaxial silicon islands created as the uniquely structured and situated products of the process.

The structure in FIG. 1 is next anisotropically etched, for example, employing reactive ion etching (RIE), to remove, as illustrated by dashed line in exposed regions 4 and 6, exposed silicon dioxide layer 2 and a depth nominally ranging from 0.3-2.0 micrometers of substrate 1. Preferably, following a strip of photoresist 3, a thin 0.02 micrometer silicon dioxide layer is grown substrate trenches 10 to remove silicon damaged by the RIE etch. Any sacrifical silicon dioxide so formed is stripped prior to undertaking the epitaxial growth.

Substrate 1, in the presence of patterned silicon dioxide mask 2, is next subjected to epitaxial deposition of monocrystalline silicon in any one of the various known techniques, e.g. RTP-CVD, LPCVD or APCVD, with in situ doping to form heavily doped epitaxial silicon regions 7 and 8 directly onto lightly doped substrate 1. Next, respective epitaxial silicon regions 9 and 11 are selectively grown onto regions 7 and 8 to a level approaching that of silicon dioxide layer 2. The selectivity of the epitaxial growth ensures that this silicon is of epitaxial quality and confined to regions 4 and 6. The parameters for accomplishing selectivity in the expitaxial growth are relatively well known.

Nominally, the doping concentration of the highly doped epitaxial regions 7 and 8 is $5 \times 10^{19}$ atoms per square centimeter, while lightly doped regions 9 and 11 are of the same impurity type as 7 and 8 but doped to a significantly lighter level of impurity. A representative concentration would be $0.5 \times 10^{15} - 5 \times 10^{15}$ atoms per cubic centimeter for both substrate 1 and epitaxial regions 9 and 11. It should be noted that the anodization step which follows requires current flow across the junction between the lightly doped substrate and the heavily doped regions 7 and 8. If the impurity types differ, the junction limits current flow to a single direction.

Figure 2:
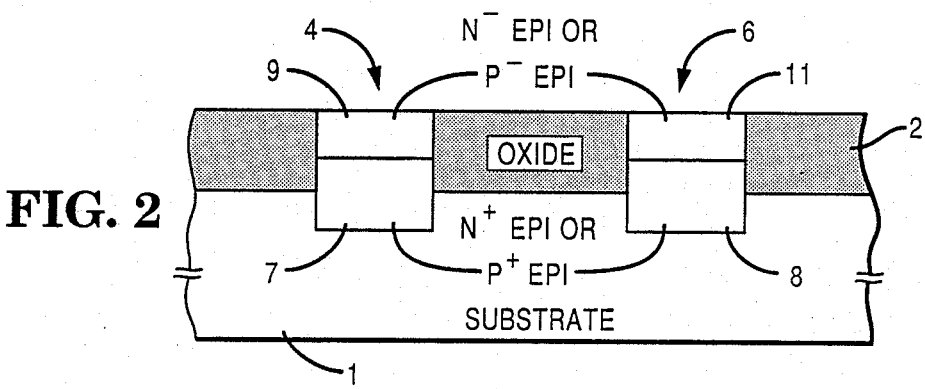

For the representative structural dimensions recited hereinbefore, the thicknesses of heavily doped epitaxial layers 7 and 8 nominally range from 0.4-3.0 micrometers while the lightly doped epitaxial layers 9 and 11 would nominally range from 0.3-1.0 micrometers. Thereby, as depicted in FIG. 2, heavily doped epitaxial layers 7 and 8 project above the plane defined by the upper surface of substrate 1 in an amount ranging from 0.1-1.0 micrometers.

The preferred practice of the invention next contemplates a highly selective etch of silicon dioxide masking layer 2, performed so as to minimize any degradation of the epitaxial layer or substrate.

Figure 3:
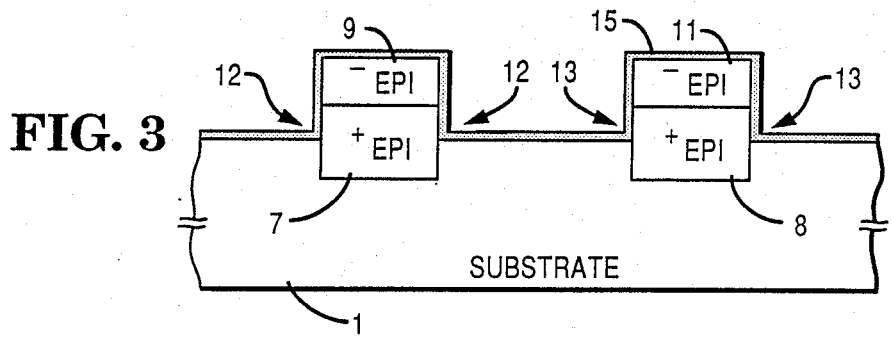

Optionally, a thin thermal silicon dioxide layer 15 is next grown to initiate anodization, as generally depicted in FIG. 3. Note the presence of exposed sidewalls 12 and 13 of respective heavily doped epitaxial layers 7 and 8, and the recessed nature of such layers 7 and 8 below the surface of substrate 1.

Figure 4:
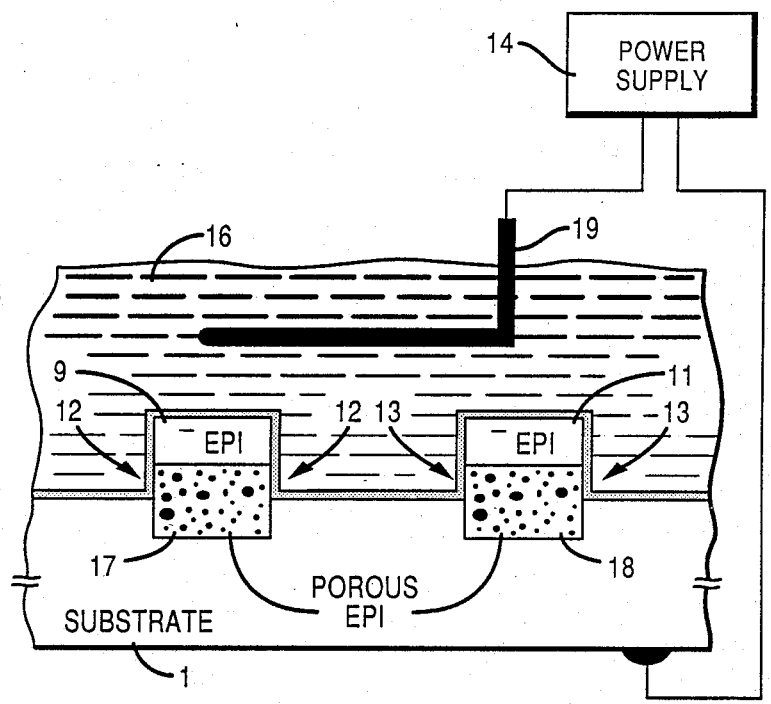

FIG. 4 illustrates the next stage of fabrication, wherein substrate 1 with integral epitaxial layers 7, 8, 9 and 11 is subjected to anodization using power supply 14. Preferably supply 14 is a galvanostatic pulse generator configured to produce a current density of 30-200 milliampere per square centimeter in solution 16, which solution is composed of 30-80% HF with ethanol or deionized water. Anodization is continued until the heavily doped epitaxial regions 7 and 8 are converted to porous epitaxial regions 17 and 18 with a nominal porosity of 50-60%. As depicted, one terminal of power supply 14 is electrically common to lightly doped substrate 1, by direct connection or otherwise, while the other terminal is connected to platinum electrode 19 submerged in solution 16. The electrical connection as shown in FIG. 4 is merely a schematic representation of the functional implementation, and could be practiced in equipment such as appears in U.S. Pat. No. 4,628,591. The important aspect of the depiction in FIG. 4 is the presence of epitaxial layer sidewall access regions 12 and 13, which concentrate and consistently define paths for electrical current and silicon migration between solution 16 and substrate 1.

The anodization current acts selectively on the heavily doped epitaxial silicon regions 7 and 8, a selectivity ensured by the direct access paths provided along sidewalls 12 and 13. At the conclusion of the anodization step, porous regions 17 and 18 retain their boundary dimension integrity yet have become relatively undoped regions of porous silicon. Thereby, the composite structure now includes porous epitaxial regions 17 and 18 situated beneath lightly doped monocrystalline epitaxial silicon regions 9 and 11.

For the illustrative configuration described above, silicon regions doped to impurity concentrations of $10^{18}$ atoms per cubic centimeter and above are anodized, while substantially no anodization current flow through regions having impurity concentrations below $10^{17}$ atoms per square centimeter.

Figure 5:
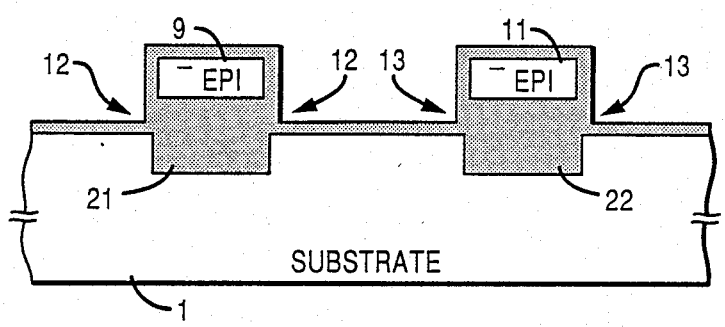

Electrical isolation of epitaxial regions 9 and 11 to create monocrystalline silicon islands separated by a dielectric from each other and substrate 1 is accomplished by converting porous epitaxial silicon regions 17 and 18 into silicon dioxide. The oxidation operation, which produces the structure in FIG. 5, is preferably accomplished in a succession of two steps. The first step involves a low temperature oxidation to stabilize the porous silicon and prevent cracking or crazing, and is nominally implemented at 650°–850° C. in a dry oxygen environment. The second and concluding oxidation operation is performed in a wet oxygen ambient at approximately 1,000° C. Experience has shown that the oxidation rate of porous silicon is approximately 100 times faster than the rate of both the monocrystalline silicon substrate 1 and the lightly doped epitaxial silicon regions 9 and 11. Consequently, buried dielectric regions of silicon dioxide 21 and 22 are completely formed before material layers of silicon dioxide form onto substrate 1 or epitaxial silicon regions 9 and 11.

The rate and comprehensiveness of the porous silicon oxidation is accentuated by the presence of aforenoted sidewall access paths 12 and 13, here providing a direct path for oxygen species into the porous epitaxial silicon regions notwithstanding their capped structural disposition. The importance of such sidewall regions of access should not be underestimated, given the prevailing importance of manufacturability and reproducibility in modern semiconductor fabrication processes. For instance, because the sidewall access path is defined by dimensional differences involving precisely controllable deposition and etching operations, the rate of oxidation and associated oxidation time can be defined with relative accuracy.

Additional structural features provided through the use of the present process may be identified and appreciated from the interim structure depicted in FIG. 5. First, the silicon island regions 9 and 11 are monocrystalline in character. The islands are consistently isolated by dielectric from substrate 1 in that the intermediate dielectrics 21 and 22 are formed from an epitaxial layer which extended above the surface plane of the substrate. Next, recessing of dielectric regions 21 and 22 into substrate 1 minimizes capacitive coupling between the islands and substrate 1. Relatively thick dielectrics 21 and 22 also reduce the electric field effects of voltages on the islands 9 and 11, to the extent that inversion and sub-threshold leakage current effects are eliminated in the underlying regions of substrate 1.

Figure 6:
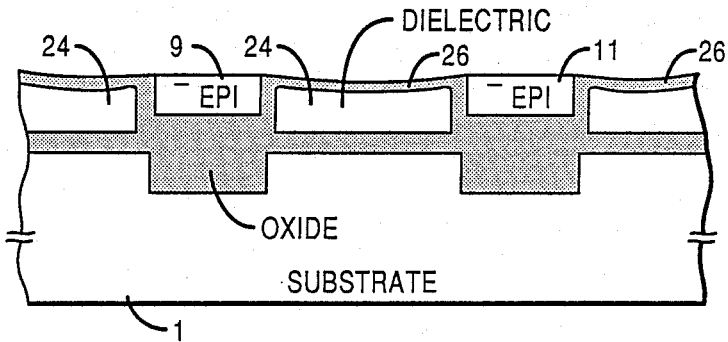

Planarization of the structure in FIG. 5 follows utilizing any one of numerous techniques. For example, as depicted in FIG. 6, dielectric regions 24 can be deposited undoped polycrystalline silicon which, following a planarizing etch-back, are surface oxidized to form a silicon dioxide surface layers 26. Upon the conclusion of planarization, the expitaxial silicon islands 9 and 11 are exposed at their upper surfaces yet situated within dielectric which isolates the islands from one another and the substrate 1.

Figure 8:
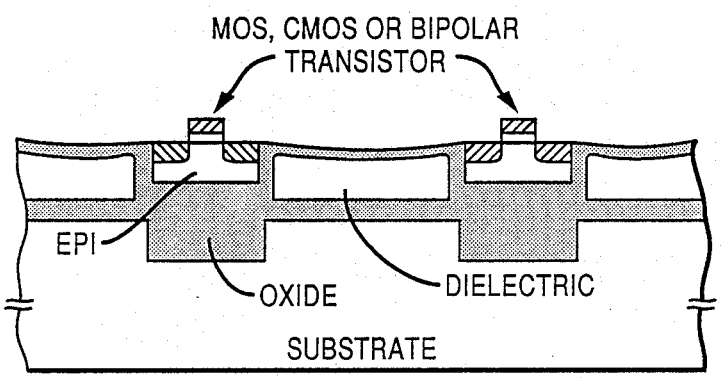

Field effect and bipolar transistors are fabricated in epitaxial silicon of islands 9 and 11 employing relatively conventional techniques. A representative field effect transistor arrangement is depicted in FIG. 8. The accentuated degree of electrical isolation provided by the thick dielectric layers is clearly evident.

Figure 7:
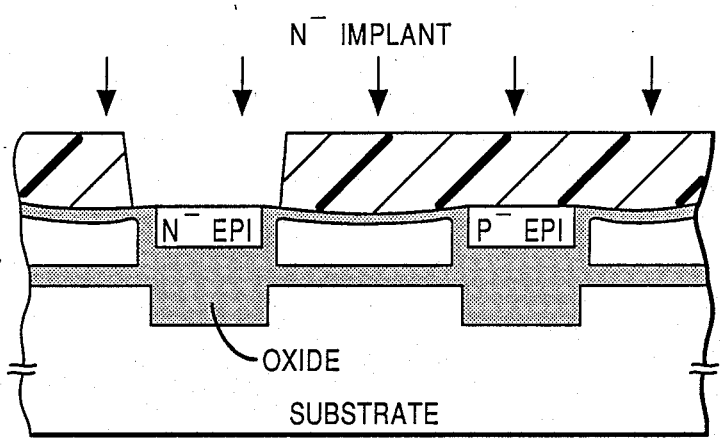

The flexibility of the fabrication process is demonstrated in extending the concluding SOI structure to complementary transistor fabrication, whether it be CMOS field effect devices or complementary bipolar transistors, with a single mask and implant sequence Where, as illustrated in FIG. 7, the original epitaxial island regions are lightly doped with p-type material, a photolighographic masking and counter doping implant of nominally $2 \times 10^{12} - 5 \times 10^{12}$ ions per square centimeter dose using phosphorous produces a lightly doped complementary epitaxial region 27.

The concluding structure for a CMOS embodiment is again that depicted in FIG. 8. It should be evident that the pair of field effect transistors shown in the figure could be bipolar transistors, and similarly could be of the same or complementary class Note the silicon-on-insulator (SOI) appearance of the structure, and particularly the arrangement of the epitaxial regions to be relatively coextensive with recesses of silicon dioxide dielectric into the substrate. Capacitive coupling and electric field effects between epitaxial island resident voltages and the substrate are effectively eliminated.

It will be understood by those skilled in the art that the embodiments set forth hereinbefore are merely exemplanary of the numerous arrangements by which the invention may be practiced, and as such may be replaced by equivalents without departing from the invention which will now be defined by appended claims.

We claim:

1. A silicon on insulator fabrication process, comprising the steps of:
   forming onto a silicon substrate a layer of first material not conductive to epitaxial silicon formation;
   etching in the presence of a patterned mask through the layer of first material and into the substrate thereby forming walls,
   forming in said wells and in succession a materially doped epitaxial layer and a lightly doped epitaxial layer onto exposed substrate;
   selectively removing said layer of first material;
   selectively anodizing the materially doped epitaxial layer to make the layer porous; and
   oxidizing the porous epitaxial layer to form silicon dioxide electrically isolating the lightly doped epitaxial layer from the substrate.

2. The process recited in claim 1, wherein the materially doped epitaxial layer extends materially above a plane defined by the surface of the substrate.

3. The process recited in claim 2, wherein the first material is silicon dioxide.

4. The process recited in claim 2, wherein the first material is silicon nitride.

5. The process recited in claim 2, wherein the porosity of the anodized layer is approximately 50–60%.

6. The process recited in claim 5, wherein the oxidation step includes a low temperature oxidation to stabilize the porous epitaxial layer and a succeeding high temperature and oxygen ambient oxidation to convert substantially all the porous epitaxial layer to silicon dioxide.

7. The process recited in claim 5, wherein the oxidation step includes a low temperature oxidation to stabilize the porous epitaxial layer and a succeeding high temperature and oxygen ambient oxidation to convert substantially all the porous epitaxial layer to silicon dioxide.

8. The process recited in claim 7, including the additional step of
planarizing the structure to fill the regions between the islands of lightly doped epitaxial layer with dielectric.

9. The process recited in claim 8, wherein the step of planarizing the structure includes filling regions between the epitaxial layer with undoped silicon and silicon dioxide, depositing a layer of planarizing material, and etching the structure to expose the surfaces of the lightly doped epitaxial layer.

10. A process for forming islands of monocrystalline silicon dielectrically isolated from the silicon substrate, comprising the steps of:
forming a relatively thick layer of silicon dioxide in the substrate;
anisotripically etching in the presence of a patterned mask through the silicon dioxide and into the substrate to form trenches;
selectively growing epitaxial silicon from the exposed substrate in said trenches to form a first materially doped epitaxial layer extending to a level above a plane defined by the surface of the substrate;
selectively growing onto the first epitaxial layer a second lightly doped epitaxial layer;
selectively removing said silicon dioxide;
selectively anodizing the first epitaxial layer to make the layer porous;
selectively oxidizing the porous first epitaxial layer to form silicon dioxide isolating the second lightly doped epitaxial layer from the substrate; and
planarizing the structure to fill the regions between the second lightly doped epitaxial layer with dielectric substantially coplanar therewith.

11. The process recited in claim 3, wherein the substrate, materially doped epitaxial layer, and lightly doped epitaxial layer are of the same impurity type.

12. The process recited in claim 11, including the additional step of doping in the presence of a mask a selected lightly doped epitaxial layer region to change the impurity type thereof.

13. The process recited in claim 10, wherein the substrate, materially doped epitaxial layer, and lightly doped epitaxial layer are of the same impurity type.

14. The process recited in claim 13, including the additional step of doping in the presence of a mask a selected lightly doped epitaxial layer region to change the impurity thereof.

* * * * *

UNITED STATES PATENT AND TRADEMARK OFFICE
CERTIFICATE OF CORRECTION

PATENT NO. : 4,910,165

DATED : March 20, 1990

INVENTOR(S) : Steven S. Lee et al.

It is certified that error appears in the above-identified patent and that said Letters Patent is hereby corrected as shown below:

Column 6, line 46, delete "conductive" and substitute --conducive--.

Column 6, line 49, delete "walls" and substitute --wells--.

Column 8, line 1, delete "anisotripically" and substitute --anisotropically--.

Signed and Sealed this

Fourteenth Day of May, 1991

Attest:

HARRY F. MANBECK, JR.

*Attesting Officer*     *Commissioner of Patents and Trademarks*